(12) United States Patent
Katayama

(10) Patent No.: US 8,153,748 B2
(45) Date of Patent: Apr. 10, 2012

(54) THERMOSETTING COMPOSITION

(75) Inventor: Hiroyuki Katayama, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 267 days.

(21) Appl. No.: 12/553,227

(22) Filed: Sep. 3, 2009

(65) Prior Publication Data

US 2010/0059788 A1 Mar. 11, 2010

(30) Foreign Application Priority Data

Sep. 11, 2008 (JP) ................................ 2008-233863

(51) Int. Cl.
*C08G 77/22* (2006.01)

(52) U.S. Cl. .............................. 528/30; 528/33; 428/447

(58) Field of Classification Search .................. 528/30, 528/33; 428/447
See application file for complete search history.

(56) References Cited

U.S. PATENT DOCUMENTS

| | | | | |
|---|---|---|---|---|
| 3,971,747 A | * | 7/1976 | Bank et al. | 523/435 |
| 5,134,197 A | * | 7/1992 | Yamamori et al. | 525/100 |
| 5,614,654 A | * | 3/1997 | Miyake et al. | 556/10 |
| 6,140,445 A | | 10/2000 | Su et al. | |
| 7,276,562 B2 | * | 10/2007 | Kashiwagi et al. | 525/476 |
| 2002/0115811 A1 | | 8/2002 | Huang et al. | |
| 2009/0134426 A1 | | 5/2009 | Katayama et al. | |
| 2009/0227757 A1 | | 9/2009 | Katayama et al. | |

FOREIGN PATENT DOCUMENTS

| | | |
|---|---|---|
| DE | 27 19 091 | 1/1978 |
| EP | 2 065 429 A1 | 6/2009 |
| JP | 11-302499 | 11/1999 |

OTHER PUBLICATIONS

U.S. Appl. No. 12/419,618, filed Apr. 7, 2009, Katayama.
U.S. Appl. No. 12/549,956, filed Aug. 28, 2009, Katayama.

* cited by examiner

*Primary Examiner* — Margaret Moore
(74) *Attorney, Agent, or Firm* — Oblon, Spivak, McClelland, Maier & Neustadt, L.L.P.

(57) ABSTRACT

A thermosetting composition containing an aluminosiloxane, a silicone oil containing silanol groups at both ends, and a silicone alkoxy oligomer. The thermosetting composition of the present invention can be used for, for example, encapsulating materials, coating materials, molding materials, surface-protecting materials, adhesive agents, bonding agents, and the like. Especially, in a case where the thermosetting composition of the present invention is used as an encapsulating material, the thermosetting composition is suitably used for, for example, photosemiconductor devices mounted with blue or white LED elements (backlights for liquid crystal displays, traffic lights, outdoor big displays, advertisement sign boards, and the like).

20 Claims, No Drawings

THERMOSETTING COMPOSITION

FIELD OF THE INVENTION

The present invention relates to a thermosetting composition and a photosemiconductor device obtained by using the composition.

BACKGROUND OF THE INVENTION

Conventionally, epoxy resins have been widely used in many ways for encapsulation of an LED element (for example, Japanese Patent Laid-Open No. Hei 11-302499). However, in an LED device with high brightness which is in need of an application to general illuminations, a material for encapsulation of a photosemiconductor element having light fastness (for example, brightness-maintaining percentage) in order to meet the need of high brightness, and transparency (for example, light transmittance), while having heat resistance in order to meet the need of an increase in an amount of heat generated upon lighting-up is desired.

SUMMARY OF THE INVENTION

The present invention relates to:
[1] a thermosetting composition containing an aluminosiloxane, a silicone oil containing silanol groups at both ends, and a silicone alkoxy oligomer;
[2] a thermosetting composition obtained or obtainable by the steps of
  reacting a silicone oil containing silanol groups at both ends and aluminum isopropoxide to provide a mixture (A) containing an aluminosiloxane and unreacted silicone oil containing silanol groups at both ends, and
  mixing the mixture (A) and a silicone alkoxy oligomer (B); and
[3] a photosemiconductor device containing a photosemiconductor element encapsulated with the thermosetting composition as defined in the above item [1] or [2].

DETAILED DESCRIPTION OF THE INVENTION

In a case where an epoxy resin is used in an LED device with high brightness, there are some disadvantages that the resin does not have sufficient transparency and has low heat resistance, so that the resin is discolored into a yellowish color during lighting-up of an LED element, thereby lowering its brightness.

In addition, improvement in heat resistance, light fastness or the like by using a silicone resin composition is proposed. However, in some cases, a silicone resin composition or a cured product thereof becomes opaque under certain conditions, thereby drastically lowering transparency. In addition, in some cases, mechanical strength such as tensile modulus of a cured product obtained is insufficient. Therefore, a composition capable of offering not only heat resistance, light transmittance, and brightness-maintaining percentage, but also tensile modulus is desired.

The present invention relates to a thermosetting composition capable of offering not only excellent heat resistance, light transmittance, and brightness-maintaining percentage but also excellent tensile modulus, and a photosemiconductor device containing a photosemiconductor element encapsulated with the thermosetting composition.

According to the present invention, a thermosetting composition capable of offering not only excellent heat resistance, light transmittance, and brightness-maintaining percentage but also excellent tensile modulus, and a photosemiconductor device containing a photosemiconductor element encapsulated with the thermosetting composition can be provided.

These and other advantages of the present invention will be apparent from the following description.

A feature of the thermosetting composition of the present invention resides in that the thermosetting composition contains an aluminosiloxane, a silicone oil containing silanol groups at both ends, and a silicone alkoxy oligomer. In the thermosetting composition, it is considered that a polycondensation reaction is caused between each of hydroxyl groups of the aluminosiloxane and the silicone oil containing silanol groups at both ends, and an alkoxy group of the silicone alkoxy oligomer, so that a compound having transparency, a large number of crosslinking, high crosslinking density and large bond energy is obtained, whereby the thermosetting composition offers not only excellent light transmittance and heat resistance but also excellent tensile modulus. In addition, it is considered that the thermosetting composition has no absorption in the ultraviolet region in which an organic substance is degraded, and is less likely to undergo photodegradation, so that the thermosetting composition shows excellent brightness-maintaining percentage upon encapsulation.

In the present invention, the aluminosiloxane may be a compound having three units of poly(dimethyl siloxanes) each bound to an aluminum atom via an oxygen atom as a backbone. It is preferable that the aluminosiloxane is a compound represented by the formula (I):

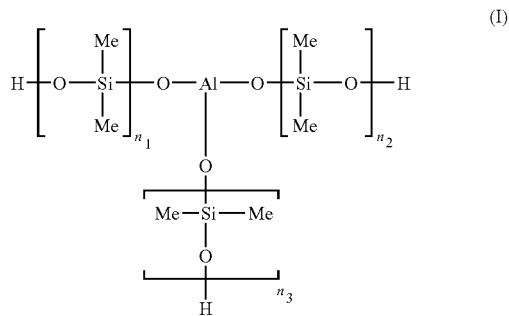

wherein an average of $n_1$ to $n_3$ is from 40 to 155.

The average of $n_1$ to $n_3$ in the formula (I) is preferably from 40 to 155.

The aluminosiloxane is contained in an amount of preferably from 0.1 to 50% by weight, and more preferably from 1 to 15% by weight, of the thermosetting composition, from the viewpoint of curing rate.

The aluminosiloxane, for example, the compound represented by the formula (I) is not particularly limited, and a compound, for example, obtained by reacting a silicon-containing compound and an aluminum compound described later can be used.

The silicon-containing compound includes silicone oils containing silanol groups at both ends, such as poly(dimethyl siloxanes) containing silanol groups at both ends, silicone oils containing a silanol group at one end, silanol and disilanol, from the viewpoint of reactivity. Among them, it is preferable to use the silicone oil containing silanol groups at both ends.

In the present invention, it is preferable that the silicone oil containing silanol groups at both ends is a compound represented by the formula (II):

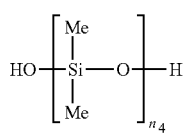

(II)

wherein $n_4$ is from 40 to 155.

$n_4$ in the formula (II) is preferably from 40 to 155.

The silicone oil containing silanol groups at both ends has a number-average molecular weight of preferably from 3000 to 11500.

Commercially available products of the silicone oil containing silanol groups at both ends include X-21-5842 (commercially available from Shin-Etsu Chemical Co., Ltd.), KF-9701 (commercially available from Shin-Etsu Chemical Co., Ltd.), and the like.

The aluminum compound includes aluminum methoxide, aluminum ethoxide, aluminum isopropoxide, aluminum butoxide, and the like, and these aluminum compounds can be used alone or in a combination of two or more kinds. Among them, it is preferable to use aluminum isopropoxide. Commercially available products of the aluminum isopropoxide include aluminum isopropoxide such as 016-16015 manufactured by Wako Pure Chemicals Industries, Ltd.

It is preferable that the silicon-containing compound and the aluminum compound used in the synthesis reaction of an aluminosiloxane, for example, the compound represented by the formula (I), are in a weight ratio, i.e. silicon-containing compound/aluminum compound, of from 5/1 to 1000/1.

The reaction of the silicon-containing compound and the aluminum compound can be carried out, for example, at a temperature of from 20° to 100° C. for 1 to 24 hours, while stirring in the absence of a solvent. Thereafter, insoluble substances are removed by centrifugation, and the solution is concentrated under a reduced pressure preferably at a temperature of from 40° to 100° C. for preferably 1 to 6 hours, whereby a compound can be obtained, without being limited thereto.

In the present invention, in a case where the aluminosiloxane is synthesized by reacting the silicone oil containing silanol groups at both ends and the aluminum isopropoxide, not only the aluminosiloxane but also the unreacted silicone oil containing silanol groups at both ends may be present in a mixture (reaction mixture). Therefore, in the present invention, a mixture obtained by reaction of synthesis of an aluminosiloxane, which contains an aluminosiloxane and the unreacted silicone oil containing silanol groups at both ends (hereinafter also referred to as a mixture of an aluminosiloxane and a silicone oil containing silanol groups at both ends), or an aluminosiloxane and a silicone oil containing silanol groups at both ends that are separately prepared can be used in the thermosetting composition. Here, whether either the mixture or the above components separately prepared are used can be properly determined by controlling a ratio of an amount of each of the silicone oil containing silanol groups at both ends and the aluminum isopropoxide used in the reaction of synthesis of the aluminosiloxane. It is preferable that a mixture of the aluminosiloxane and the silicone oil containing silanol groups at both ends is used in the thermosetting composition, from the viewpoint of the operability of obtaining the thermosetting composition and economic advantages.

The aluminosiloxane obtained by the reaction and the silicone oil containing silanol groups at both ends that remains unreacted are in a weight ratio, i.e. aluminosiloxane/silicone oil containing silanol groups at both ends, of preferably from 1/99 to 50/50, more preferably from 3/97 to 25/75, and even more preferably from 3/97 to 15/85, from the viewpoint of curing rate, transparency and tensile strength.

The silicone oil containing silanol groups at both ends is contained in an amount of preferably from 10 to 99% by weight, and more preferably from 30 to 90% by weight, of the thermosetting composition, from the viewpoint of tensile strength.

It is preferable that the silicone alkoxy oligomer usable in the present invention is a compound in which a terminal of a molecule is blocked at least by an alkoxysilyl group represented by Si—OR, wherein R is an alkyl group, the compound having a relatively low molecular weight. Here, it is preferable that the alkyl group in the above formula is a methyl group, an ethyl group, a propyl group, an isopropyl group, a butyl group, a hexyl group, a phenyl group, a cyclohexyl group or the like. Among them, it is more preferable that the alkyl group is a methyl group.

The silicone alkoxy oligomer contains an alkoxy group in an amount of preferably from 12 to 45% by weight, and more preferably from 12 to 24% by weight from the viewpoint of strength of a cured product. The amount of the alkoxy group contained is expressed by a ratio of molecular weights of an alkoxy group to a silicone alkoxy oligomer.

The silicone alkoxy oligomer has a viscosity at 25° C. of preferably from 5 to 160 mPa·s, and more preferably from 80 to 100 mPa·s. The viscosity can be calculated with a rheometer under the conditions of a temperature of 25° C. and 1 atmospheric pressure.

The silicone alkoxy oligomer is contained in an amount of preferably from 5 to 95% by weight, and more preferably from 10 to 50% by weight, of the thermosetting composition, from the viewpoint of tensile strength.

Commercially available products of the silicone alkoxy oligomer include X-40-9225(commercially available from Shin-Etsu Chemical Co., Ltd.), X-40-9246(commercially available from Shin-Etsu Chemical Co., Ltd.) and the like.

The ratio of a total weight of an aluminosiloxane and a silicone oil containing silanol groups at both ends to a weight of a silicone alkoxy oligomer, i.e. aluminosiloxane+silicone oil containing silanol groups at both ends/silicone alkoxy oligomer, is preferably from 90/10 to 10/90, more preferably from 90/10 to 30/70, and even more preferably from 90/10 to 50/50, from the viewpoint of curing rate and tensile strength. In a case where the weight of the silicone alkoxy oligomer is 10 or more to a total weight of the aluminosiloxane and the silicone oil containing silanol groups at both ends of 90, a cured product is less likely to be too soft. On the contrary, in a case where the weight of the silicone alkoxy oligomer is 90 or less to a total weight of the aluminosiloxane and the silicone oil containing silanol groups at both ends of 10, the composition can be subjected to encapsulation processing in a semi-cured state, and wires connected to a photosemiconductor element are not subjected to deformation, even when the composition has too high a viscosity.

The thermosetting composition is obtained by, for example, the steps of reacting a silicone oil containing silanol groups at both ends and aluminum isopropoxide to provide a mixture (A) containing an aluminosiloxane and unreacted silicone oil containing silanol groups at both ends, and mixing the mixture (A) and a silicone alkoxy oligomer (B). In addition, the thermosetting composition can be obtained by mixing immediately before use the above components prepared separately or the above components available commercially.

Besides the above components, the thermosetting composition may contain an optional component such as a silicone resin, a silane coupling agent, or inorganic particles of silica or the like.

The thermosetting composition has a viscosity at 25° C. of preferably from 5 to 10000 mPa·s, and more preferably from 100 to 5000 mPa·s from the viewpoint of easy paintability. The viscosity can be calculated with a rheometer under the conditions of a temperature of 25° C. and 1 atmospheric pressure.

The thermosetting composition is prepared in a state without a solvent, so that it is preferable that the thermosetting composition is directly used to cure. In addition, it is preferable that the thermosetting composition is cured by a primary curing into a semi-cured state and a secondary curing into a completely cured state, from the viewpoint of the handling property. Here, the conditions of the primary curing include the conditions of curing at a temperature of from 100° to 200° C. for a period of from 1 to 120 minutes. The conditions of the secondary curing include the conditions of curing at a temperature of from 100° to 200° C. for 1 to 240 hours.

The thermosetting composition of the present invention can be used for encapsulating materials, coating materials, molding materials, surface-protecting materials, adhesive agents, bonding agents, and the like. Especially, in a case where the thermosetting composition of the present invention is used as an encapsulating material, the thermosetting composition is suitably used for, for example, photosemiconductor devices mounted with blue or white LED elements (backlights for liquid crystal displays, traffic lights, outdoor big displays, advertisement sign boards, and the like). Therefore, it is preferable that the thermosetting composition of the present invention is a composition for encapsulating a photosemiconductor element.

In a preferred embodiment of the present invention, a sheet for encapsulating a photosemiconductor element, made from the above thermosetting composition is provided. For example, the sheet for encapsulating a photosemiconductor element can be used by molding the thermosetting composition into a sheet in a semi-cured state. A method for molding the composition into the sheet includes a method including the step of applying a thermosetting composition on the glass plate using a method such as spin-coating, an applicator, casting, or roll-coating, and thereafter subjecting the coating to primary curing as mentioned above. The thermosetting composition has excellent handling property by molding into a sheet in a semi-cured state, and further can be subjected to secondary curing to encapsulate the subject.

The sheet for encapsulating a photosemiconductor element has a thickness of preferably from 100 to 2000 μm, and more preferably from 300 to 800 μm, from the viewpoint of completely embedding the elements.

The present invention also provides a photosemiconductor device containing a photosemiconductor element encapsulated with the above thermosetting composition.

The photosemiconductor device of the present invention can be produced by encapsulating, for example, LED elements or the like with the above thermosetting composition or the sheet for encapsulating a photosemiconductor element made from the thermosetting composition. Specifically, in a case where the sheet for encapsulating a photosemiconductor element is used, the photosemiconductor device can be produced by mounting the sheet for encapsulating a photosemiconductor element in a semi-cured state in an appropriate thickness according to methods such as casting on a substrate mounted with LED elements, and subjecting the sheet to an encapsulation processing under a reduced pressure, preferably at a temperature of from 50° to 200° C. and a pressure of from 0.05 to 0.5 MPa, and then subjecting the encapsulated sheet to secondary curing including heating the sheet at a temperature of preferably from 100° to 200° C. for a period of preferably from 1 to 240 hours, thereby encapsulating the photosemiconductor elements. In addition, in a case where the thermosetting composition is used, the photosemiconductor device can be produced by, for example, directly applying a thermosetting composition in an appropriate thickness to a substrate mounted with LED elements and the like according to a method employing an applicator, casting, spin-coating, roll-coating or the like, thereby encapsulating the photosemiconductor elements under the above conditions for the primary curing and the secondary curing.

EXAMPLES

The following examples further describe and demonstrate embodiments of the present invention. The examples are given solely for the purposes of illustration and are not to be construed as limitations of the present invention.

Synthesis Example 1

To 200 g (17.4 mmol) of a silicone oil containing silanol groups at both ends [a compound represented by the formula (II), in which $n_4$ is 155, X-21-5842, commercially available from Shin-Etsu Chemical Co., Ltd., number-average molecular weight: 11500] was added 0.275 g (1.35 mmol) of aluminum isopropoxide (016-16015, commercially available from Wako Pure Chemical Industries, Ltd.), and the components were reacted at room temperature (25° C.) for 24 hours in the absence of a solvent while stirring. Thereafter, the reaction mixture was centrifuged to remove insoluble substances, and the solution was concentrated under a reduced pressure at 50° C. for 2 hours, to provide a mixture containing an aluminosiloxane [a compound represented by the formula (I), in which an average of $n_1$ to $n_3$ is 155] and a silicone oil containing silanol groups at both ends [a compound represented by the formula (II), in which $n_4$ is 155] in the form of a colorless, transparent oil (weight ratio: aluminosiloxane/silicone oil containing silanol groups at both ends=23/77).

Synthesis Example 2

To 200 g (66.7 mmol) of a silicone oil containing silanol groups at both ends [a compound represented by the formula (II), in which $n_4$ is 40, KF-9701, commercially available from Shin-Etsu Chemical Co., Ltd., number-average molecular weight: 3000] was added 0.275 g (1.35 mmol) of aluminum isopropoxide (016-16015, commercially available from Wako Pure Chemical Industries, Ltd.), and the components were reacted at room temperature (25° C.) for 24 hours in the absence of a solvent while stirring. Thereafter, the reaction mixture was centrifuged to remove insoluble substances, and the solution was concentrated under a reduced pressure at 50° C. for 2 hours, to provide a mixture containing an aluminosiloxane [a compound represented by the formula (I), in which an average of $n_1$ to $n_3$ is 40] and a silicone oil containing silanol groups at both ends [a compound represented by the formula (II), in which $n_4$ is 40] in the form of a colorless, transparent oil (weight ratio: aluminosiloxane/silicone oil containing silanol groups at both ends=6/94).

Examples 1 to 4

To the mixture obtained in Synthesis Example 1 or 2 was added a silicone alkoxy oligomer [(1) X-40-9246 : the amount of a methoxy group contained 12% by weight, viscosity 80 mPa·s, or (2) X-40-9225 : the amount of a methoxy group contained 24% by weight, viscosity 100 mPa·s (both commercially available from Shin-Etsu Chemical Co., Ltd)] in a weight ratio shown in Table 1, and mixed, to provide a thermosetting composition in an oily state (viscosity: 200 to 1000 mPa·s). Thereafter, the resulting thermosetting composition was applied to a PET film with Comma Coater so as to have a thickness of 400 μm. The coating was subjected to primary curing at a temperature for a time period shown in Table 1, to provide a sheet for encapsulating a photosemiconductor element in a semi-cured state.

The above sheet for encapsulating the photosemiconductor element in a semi-cured state was covered over the substrate mounted with the blue LEDs, and the sheet was heated at 160° C. under a reduced pressure, and encapsulated at a pressure of 0.2 MPa, and further was subjected to secondary curing at 150° C. for 24 hours, to provide a photosemiconductor device. In addition, the sheet for encapsulating the photosemiconductor element in a semi-cured state was subjected to secondary curing at a temperature for a time period shown in Table 1, and used for evaluation described later.

Comparative Example 1

Forty-five parts by weight of a bisphenol A (BFA)-containing epoxy resin having an epoxy equivalence of 7500 (EPI 1256, commercially available from Japan Epoxy Resins Co., Ltd.), 33 parts by weight of an alicyclic epoxy resin having an epoxy equivalence of 260 (EHPE3150, commercially available from DAICEL CHEMICAL INDUSTRIES, LTD.), 22 parts by weight of 4-methylhexahydrophthalic anhydride (MH-700, commercially available from New Japan Chemical Co., Ltd.), and 1.2 parts by weight of 2-methylimidazole (2MZ, commercially available from SHIKOKU CHEMICALS, CORPORATION) were dissolved in a MEK solvent on 50% base, to prepare a coating solution. This coating solution was applied to a twin-screw stretched polyester film (commercially available from Mitsubishi Chemical Polyester Film Co., Ltd., thickness: 50 μm) so as to have a thickness of 100 μm, and the coating was dried at 130° C. for 2 minutes. Further, a total of three pieces of the sheet obtained in the same manner as above were thermally laminated at 100° C., to produce an epoxy resin sheet having a thickness of 300 μm.

After a substrate mounted with blue LEDs was heated at 150° C., the above epoxy resin sheet was covered over the blue LEDs on the substrate, the sheet was encapsulated at a pressure of 0.5 MPa, and the sheet was subjected to secondary curing at 150° C. for 2 hours, to provide a photosemiconductor device.

Comparative Example 2

A mixture of the aluminosiloxane and the silicone oil containing silanol groups at both ends obtained in Synthesis Example 2 was applied to a PET film with Comma Coater so as to have a thickness of 400 μm. The coating was subjected to primary curing at a temperature for a time period shown in Table 1, to provide a silicone resin sheet in a semi-cured state.

The above silicone resin sheet in a semi-cured state was then covered over a substrate mounted with blue LEDs, and the sheet was heated at 160° C. under a reduced pressure and encapsulated at a pressure of 0.2 MPa. Further, the encapsulated sheet was subjected to secondary curing at 200° C. for 24 hours, to provide a photosemiconductor device. In addition, the silicone resin sheet in a semi-cured state was subjected to secondary curing at a temperature for a time period shown in Table 1, and used for evaluation described later.

(Evaluation Method)

The sheet for encapsulating a photosemiconductor element, the epoxy resin sheet, the silicone resin sheet, and the photosemiconductor device obtained above were evaluated as detailed below. The results are shown in Table 1.

(1) Tensile Modulus

Tensile modulus (MPa) of the sheets subjected to primary curing and secondary curing of Examples 1 to 4 or Comparative Example 2 and the epoxy resin sheet of Comparative Example 1 was determined at 25° C. with AUTOGRAPH (AGS-J; commercially available from Shimadzu Corporation).

(2) Light Transmittance

The light transmittance at a wavelength of 450 nm was determined for each of the sheets subjected to secondary curing of Examples 1 to 4 or Comparative Example 2 and the epoxy resin sheet of Comparative Example 1, with a spectrophotometer (U-4100, commercially available from Hitachi High-Technologies Corporation).

(3) Heat Resistance

The sheet subjected to secondary curing of each of Examples 1 to 4 or Comparative Example 2 and the epoxy resin sheet of Comparative Example 1 were allowed to stand in a hot air dryer at 150° C. The transparency of each of the sheets after 100 hours passed was visually observed. One that does not undergo any discoloration from the condition before storage is evaluated as ○, and one that shows discoloration from the condition before storage is evaluated as ×.

(4) Brightness-Maintaining Percentage

Electric current of 300 mA was allowed to flow through each of photosemiconductor devices obtained by Examples 1 to 4 and Comparative Examples 1 to 2, and the brightness immediately after the beginning of the test was determined with MCPD (Multi-Channel Photo-Detector System MCPD-3000, commercially available from Otsuka Electronics Co., Ltd.). Thereafter, the photosemiconductor device was allowed to stand in a state of lighting-up, and the brightness after 300 hours passed was determined in the same manner. The brightness-maintaining percentage was calculated by the following formula:

TABLE 1

$$\text{Brightness Maintaining Percentage (\%)} = \frac{\text{Brightness After 300 Hours Passed from Continuous Lighting up at 300 mA}}{\text{Brightness Immediately After the Beginning of the Test}} \times 100$$

| (Parts by Weight) | Ex. 1 | Ex. 2 | Ex. 3 | Ex. 4 | Comp. Ex. 1 | Comp. Ex. 2 |
|---|---|---|---|---|---|---|
| Thermosetting Composition | | | | | | |
| Mixture *A-1 of Synthesis Example 1 | 90 | — | — | — | — | — |
| Mixture *A-2 of Synthesis Example 2 | — | 50 | 70 | 90 | — | 100 |

TABLE 1-continued

Brightness Maintaining Percentage (%) = $\dfrac{\text{Brightness After 300 Hours Passed from Continuous Lighting-up at 300 mA}}{\text{Brightness Immediately After the Beginning of the Test}} \times 100$

| (Parts by Weight) | Ex. 1 | Ex. 2 | Ex. 3 | Ex. 4 | Comp. Ex. 1 | Comp. Ex. 2 |
|---|---|---|---|---|---|---|
| Silicone Alkoxy Oligomer (1) *B | — | 50 | 30 | — | — | — |
| Silicone Alkoxy Oligomer (2) *C | 10 | — | — | 10 | — | — |
| Bisphenol A-Containing Epoxy Resin *D | — | — | — | — | 45 | — |
| Alicyclic Epoxy Resin *E | — | — | — | — | 33 | — |
| 4-Methylhexahydrophthalic Anhydride *F | — | — | — | — | 22 | — |
| 2-Methylimidazole *G | — | — | — | — | 1.2 | — |
| Primary Curing | | | | | | |
| Curing Temperature | 150° C. | 150° C. | 150° C. | 150° C. | — | 200° C. |
| Curing Time | 15 min. | 5 min. | 5 min. | 5 min. | — | 30 min. |
| Tensile Modulus (MPa) | 0.04 | 0.5 | 0.05 | 0.03 | — | 0.02 |
| Secondary Curing | | | | | | |
| Curing Temperature | 150° C. | 150° C. | 150° C. | 150° C. | — | 200° C. |
| Curing Time | 24 hr | 24 hr | 24 hr | 24 hr | — | 24 hr |
| Tensile Modulus (MPa) | 0.6 | 7.0 | 1.9 | 1.0 | 2000 | 0.1 |
| Light Transmittance (%) | 99 | 99 | 99 | 99 | 95 | 99 |
| Heat Resistance | ○ | ○ | ○ | ○ | X | ○ |
| Brightness-Maintaining Percentage (%) | >99 | >99 | >99 | >99 | 40 | >99 |

*A-1: A mixture of an aluminosiloxane and a silicone oil containing silanol groups at both Ends (weight ratio: 23/77)
*A-2: A mixture of an aluminosiloxane and a silicone oil containing silanol groups at both Ends (weight ratio: 6/94)
*B: X-40-9246 (commercially available from Shin-Etsu Chemical Co., Ltd.)
*C: X-40-9225 (commercially available from Shin-Etsu Chemical Co., Ltd.)
*D: EPI1256 (commercially available from Japan Epoxy Resins Co., Ltd.)
*E: EHPE3150 (commercially available from DAICEL CHEMICAL INDUSTRIES, LTD.)
*F: MH-700 (commercially available from New Japan Chemical Co., Ltd.)
*G: 2MZ (commercially available from SHIKOKU CHEMICALS CORPORATION)

It can be seen from the above that the thermosetting composition of the present invention has excellent tensile modulus, light transmittance and heat resistance upon curing, and further that a photosemiconductor device containing a photosemiconductor element encapsulated with the thermosetting composition has excellent brightness maintaining percentage.

The thermosetting composition of the present invention can be used for, for example, encapsulating materials, coating materials, molding materials, surface-protecting materials, adhesive agents, bonding agents, and the like. Especially, in a case where a thermosetting composition of the present invention is used as an encapsulating material, the thermosetting composition is suitably used for, for example, photosemiconductor devices mounted with blue or white LED elements (backlights for liquid crystal displays, traffic lights, outdoor big displays, advertisement sign boards, and the like).

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thermosetting composition comprising:
   an aluminosiloxane;
   a silicone oil comprising silanol groups at both ends; and
   a silicone alkoxy oligomer,
   wherein the aluminosiloxane is a compound represented by formula (I):

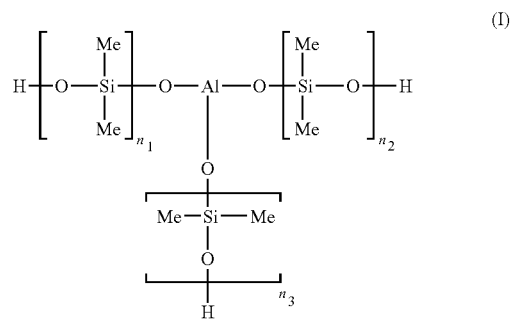

where an average of $n_1$ to $n_3$ is from 40 to 155.

2. A method for encapsulating a photosemiconductor element, comprising:
   encapsulating a photosemiconductor element with the thermosetting composition as defined in claim 1.

3. A photosemiconductor device comprising:
   a photosemiconductor element encapsulated with the thermosetting composition as defined in claim 1.

4. The thermosetting composition according to claim 1, wherein the silicone oil comprising silanol groups at both ends is a compound represented by formula (II):

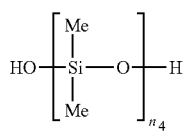

(II)

where $n_4$ is from 40 to 155.

5. The thermosetting composition according to claim 1, wherein the aluminosiloxane is included in an amount of from 1 to 15% by weight of the thermosetting composition.

6. The thermosetting composition according to claim 1, wherein the silicone alkoxy oligomer comprises an alkoxy group in an amount of from 12 to 24% by weight.

7. The thermosetting composition according to claim 1, wherein the silicone alkoxy oligomer is included in an amount of from 10 to 50% by weight of the thermosetting composition.

8. The thermosetting composition according to claim 1, wherein the silicone oil is included in an amount of from 30 to 90% by weight of the thermosetting composition.

9. A thermosetting composition comprising:
an aluminosiloxane;
a silicone oil comprising silanol groups at both ends; and
a silicone alkoxy oligomer,
wherein the silicone oil comprising silanol groups at both ends is a compound represented by formula (II):

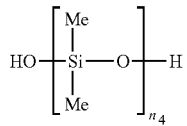

(II)

wherein $n_4$ is from 40 to 155.

10. The thermosetting composition according to claim 9, wherein the aluminosiloxane is included in an amount of from 1 to 15% by weight of the thermosetting composition.

11. The thermosetting composition according to claim 9, wherein the silicone alkoxy oligomer comprises an alkoxy group in an amount of from 12 to 24% by weight.

12. The thermosetting composition according to claim 9, wherein the silicone alkoxy oligomer is included in an amount of from 10 to 50% by weight of the thermosetting composition.

13. The thermosetting composition according to claim 9, wherein the silicone oil is included in an amount of from 30 to 90% by weight of the thermosetting composition.

14. A method for encapsulating a photosemiconductor element, comprising:
encapsulating a photosemiconductor element with the thermosetting composition as defined in claim 9.

15. A photosemiconductor device comprising:
a photosemiconductor element encapsulated with the thermosetting composition as defined in claim 9.

16. A thermosetting composition obtained by a process comprising:
reacting a silicone oil comprising silanol groups at both ends and aluminum isopropoxide to provide a mixture comprising an aluminosiloxane and unreacted silicone oil comprising silanol groups at both ends; and
mixing the mixture and a silicone alkoxy oligomer.

17. The thermosetting composition according to claim 16, wherein the aluminosiloxane is a compound represented by formula (I):

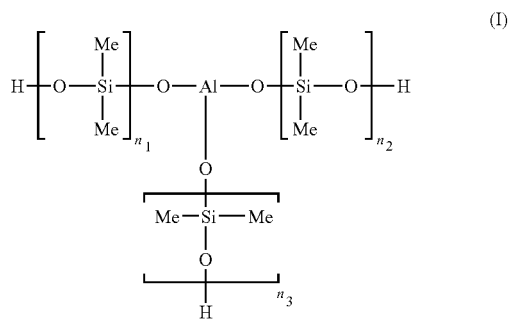

(I)

wherein an average of $n_1$ to $n_3$ is from 40 to 155.

18. The thermosetting composition according to claim 16, wherein the silicone oil comprising silanol groups at both ends is a compound represented by formula (II):

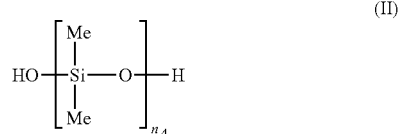

(II)

wherein $n_4$ is from 40 to 155.

19. A method for encapsulating a photosemiconductor element, comprising:
encapsulating a photosemiconductor element with the thermosetting composition as defined in claim 16.

20. A photosemiconductor device comprising:
a photosemiconductor element encapsulated with the thermosetting composition as defined in claim 16.

* * * * *